United States Patent
Golden et al.

(10) Patent No.: US 7,528,655 B2
(45) Date of Patent: May 5, 2009

(54) AMPLIFIER WITH IMPROVED COMPENSATION TOPOLOGY AND RELATED AMPLIFIER CIRCUIT, SYSTEM, AND METHOD

(75) Inventors: Philip Golden, London (GB); Peter Mole, St. Albane (GB); Barry Harvey, Los Altos, CA (US)

(73) Assignee: Intersil Americas Inc., Milpitas, CA (US)

( * ) Notice: Subject to any disclaimer, the term of this patent is extended or adjusted under 35 U.S.C. 154(b) by 99 days.

(21) Appl. No.: 11/499,560

(22) Filed: Aug. 3, 2006

(65) Prior Publication Data

US 2008/0030272 A1   Feb. 7, 2008

(51) Int. Cl.
  *H03F 3/45* (2006.01)
  *H03F 1/14* (2006.01)
(52) U.S. Cl. .......................... 330/255; 330/292
(58) Field of Classification Search .................. 330/292
  See application file for complete search history.

(56) References Cited

U.S. PATENT DOCUMENTS

| 4,721,921 | A | * | 1/1988 | Vyne et al. | 330/260 |
| 5,294,892 | A | * | 3/1994 | Ryat | 330/255 |
| 5,815,037 | A | * | 9/1998 | Tomasini et al. | 330/260 |
| 6,163,217 | A | * | 12/2000 | Matsubara et al. | 330/255 |
| 6,229,394 | B1 | | 5/2001 | Harvey | |
| 6,392,485 | B1 | * | 5/2002 | Doi et al. | 330/253 |
| 7,102,436 | B2 | * | 9/2006 | Sung | 330/255 |

OTHER PUBLICATIONS

Opt Eynde, F.N.L., et al, "A CMOS Large-Swing Low-Distortion Three-Stage Class AB Power Amplifier", IEEE JSSC, vol. 25, Issue 1, Feb. 1990, pp. 265-273.

Ribner, D., et al., "Design Techniques for Cascoded CMOS Op Amps with Improved PSRR and Common-Mode Input Range", IEEE JSSC, vol. 19, No. 6, Dec. 1984.

Carter, N., "An Opamp with Common-Mode Linearized Input Stage", IEEE ISSCC Proceedings, Feb. 15-19, 2004, pp. 466-467 vol. 1.

Paul J. Hurst, Stephen H. Lewis, John P. Keane, Farbod Aram and Kenneth C. Dyer, "Miller Compensation Using Current Buffers in Fully Differential CMOS Two-Stage Operational Amplifiers", IEEE Transactions on Circuits and Systems-I:Regular Papers, vol. 51, No. 2, Feb. 2004, pp. 275-285.

* cited by examiner

*Primary Examiner*—Robert J. Pascal
*Assistant Examiner*—Alan Wong
(74) *Attorney, Agent, or Firm*—Paul A. Bernkopf; Graybeal Jackson LLP

(57) ABSTRACT

An embodiment of an amplifier includes an amplifier output node operable to provide an output signal, and an output stage. The output stage includes a drive buffer having an input node and an output node, a drive transistor, and a compensation capacitor. The drive transistor has a control node coupled to the output node of the drive buffer, a first drive node, and a second drive node coupled to the amplifier output node. And the compensation capacitor has a first node isolated from the control node of the drive transistor by the drive buffer, and has a second node coupled to the amplifier output node. By buffering the control node of the drive transistor, one may reduce the level of nonlinear current referred back to the amplifier input as a nonlinear offset voltage, and thus may reduce the level of nonlinear distortion that his nonlinear offset voltage generates at the amplifier output.

20 Claims, 3 Drawing Sheets

AMPLIFIER WITH IMPROVED COMPENSATION TOPOLOGY AND RELATED AMPLIFIER CIRCUIT, SYSTEM, AND METHOD

BACKGROUND

FIG. 1 is a schematic diagram of an amplifier circuit 10, which includes an internally compensated operational amplifier 12 and a feedback path 14. The amplifier 12 generates an output voltage Vout, which has an amplitude that may range substantially from the negative supply voltage to the positive supply voltage (here Vdd and ground, respectively). An amplifier having this range for the amplitude of Vout is sometimes called a "rail-to-rail" amplifier, and is often used in a low-supply-voltage application. And for clarity, some components of the amplifier circuit 10 are omitted from FIG. 1.

Unfortunately, the operational amplifier 12 may generate Vout having an unwanted distortion component.

Still referring to FIG. 1, the operational amplifier 12 includes a summing junction 16, an input stage 18, an intermediate stage 20, and an output stage 22. Typically, these stages are disposed on a single monolithic integrated circuit (IC) die, and the junction 16 is disposed external to the IC including the die.

The summing junction 16 sums the negative component of Vin with Vout (or a scaled version of Vout) to generate the negative component of a differential error voltage Ve. Per standard operational-amplifier theory, because the operational amplifier 12 has a relatively high gain, it attempts to maintain Vout at a level that causes Ve to remain at or near 0 Volts. Also per standard operational-amplifier theory, the summer 16 may include circuit components that set the gain and/or the frequency response of the amplifier circuit 10 to values desirable for the application in which the amplifier circuit is used.

The input stage 18 includes a transconductance stage 24 having a gain Gm, input nodes 26a and 26b for receiving Ve, and output nodes 28a and 28b, and includes impedances 30a and 30b respectively coupled to the output nodes 28a and 28b. The transconductance stage 24 amplifies Ve to generate an intermediate differential voltage Vint, which generates an intermediate differential current Iint.

The intermediate stage 20 includes input nodes 32a and 32b for receiving Iint, cascoded input transistors 34a and 34b, a current mirror 36, and level-shifting transistors 38a and 38b coupled between output-stage drive nodes 40a and 40b. The current mirror 36 includes a diode-connected input transistor 42, and an output transistor 44. The intermediate stage 20 converts the current Iint into drive voltages VD1 and VD2 and associated drive currents. The level-shifting transistors 38a and 38b prevent a "crow bar" current from flowing between the push-pull transistors of the output stage 22 by maintaining a sufficient voltage offset between VD1 and VD2 so that the transistors of the output stage are not simultaneously "full on".

The output stage 22 includes a PMOS (push) transistor 44 having a parasitic gate-to-source capacitance Cgs1, an NMOS (pull) transistor 46 having a parasitic gate-to-source capacitance Cgs2, a first compensation capacitor C1, a second compensation capacitor C2, and an output node 48—because they need not be considered for the present discussion, the respective gate-to-drain parasitic capacitances of the transistors 44 and 46 are omitted from FIG. 1. C1 and C2 position the open-loop right-hand pole of the operational amplifier 12 so that the closed-loop amplifier circuit 10 has a stable and otherwise desirable frequency response. In one example, $C1 \approx C2 \approx 2$ pF, and $Cgs1 \approx Cgs2 \approx 4$ pF.

In operation, for a primarily resistive load RL, it is typically desired that the amplifier circuit 10 generate Vout as a linear function of Vin according to the following equation:

$$Vout = G \cdot Vin \tag{1}$$

where G is the closed-loop gain of the amplifier circuit 10 over the bandwidth of the amplifier circuit.

But because the output transistors 44 and 46 are CMOS transistors, the operational amplifier 12 may generate a nonlinear voltage on the output node 48, thus potentially causing an unacceptable level of nonlinear distortion in Vout.

As is known, $Vout = Iout \cdot RL$. Therefore, substituting $Iout \cdot RL$ for Vout in equation (1), one obtains:

$$Iout = \frac{G}{RL} \cdot Vin \tag{2}$$

But the I-V characteristic equation for the NMOS transistor 46 in the saturation region is:

$$Iout \approx Id = k(Vgs - Vt)^2 \tag{3}$$

Where Id is the drain current, k is a constant that depends on the dimensions of the NMOS transistor, Vgs=VD2 is the gate-to-source voltage, and Vt is the threshold voltage. The characteristic equation for a PMOS transistor is similar, as it also includes a squared (non-linear) term.

Therefore, to generate Iout as a linear function of Vin, the intermediate stage 20 generates nonlinear drive voltages for VD1 and VD2.

Unfortunately, at higher frequencies, both the compensation capacitors C1 and C2 and the parasitic capacitances Cgs1 and Cgs2 respectively convert these nonlinear drive voltages VD1 and VD2 into internal nonlinear currents, and thus may introduce an unacceptable level of nonlinear distortion onto Vout. Because the input and intermediate stages 18 and 20 cooperate to generate the nonlinear currents that respectively flow from the nodes 40a and 40b and through the capacitors C1 and Cgs1 and C2 and Cgs2, these nonlinear currents are effectively referred back to the input nodes 26a and 26b of the input stage as a nonlinear input offset voltage that is superimposed on Ve. The stages 18, 20, and 22 amplify this nonlinear input offset voltage, and thus generate a corresponding nonlinear output voltage on the output node 48. This nonlinear output voltage introduces a corresponding component of nonlinear distortion onto Vout.

SUMMARY

An embodiment of an amplifier includes an amplifier output node operable to provide an output signal, and an output stage. The output stage includes a drive buffer having an input node and an output node, a drive transistor, and a compensation capacitor. The drive transistor has a control node coupled to the output node of the drive buffer, a first drive node, and a second drive node coupled to the amplifier output node. And the compensation capacitor has a first node isolated from the control node of the drive transistor by the drive buffer, and has a second node coupled to the amplifier output node.

By buffering the control node of the drive transistor, one may reduce the level of nonlinear current referred back to the amplifier input as a nonlinear offset voltage, and thus may reduce the level of nonlinear distortion present at the amplifier output.

DETAILED DESCRIPTION

The following discussion is presented to enable a person skilled in the art to make and use one or more embodiments of the invention. The general principles described herein may be applied to embodiments and applications other than those detailed below without departing from the spirit and scope of the invention. Therefore the present invention is not intended to be limited to the embodiments shown, but is to be accorded the widest scope consistent with the principles and features disclosed or suggested herein.

Figure 1:
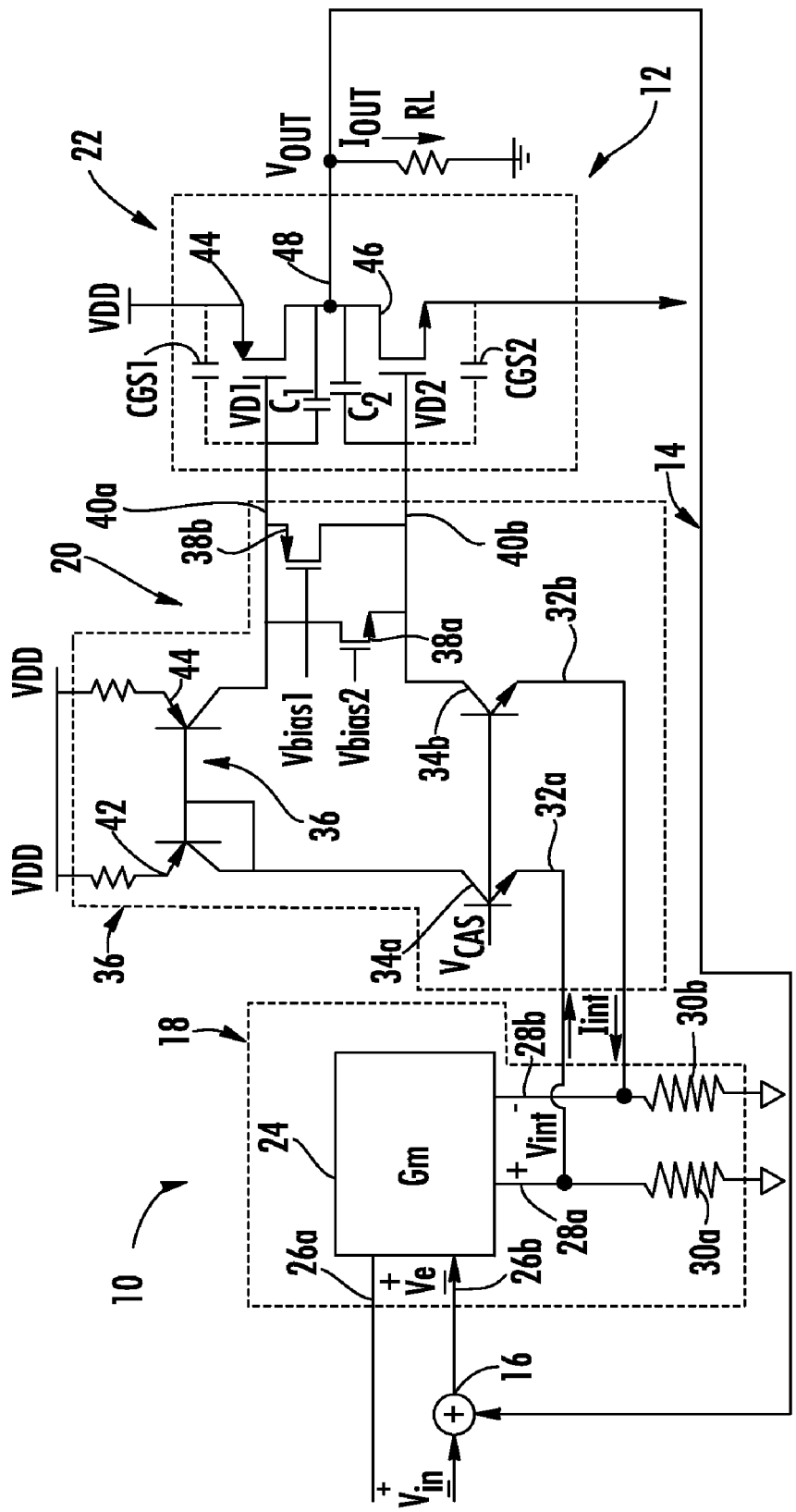
FIG. 1 is a schematic diagram of a prior internally compensated operational amplifier having a differential input and a single-ended output.
Figure 2:
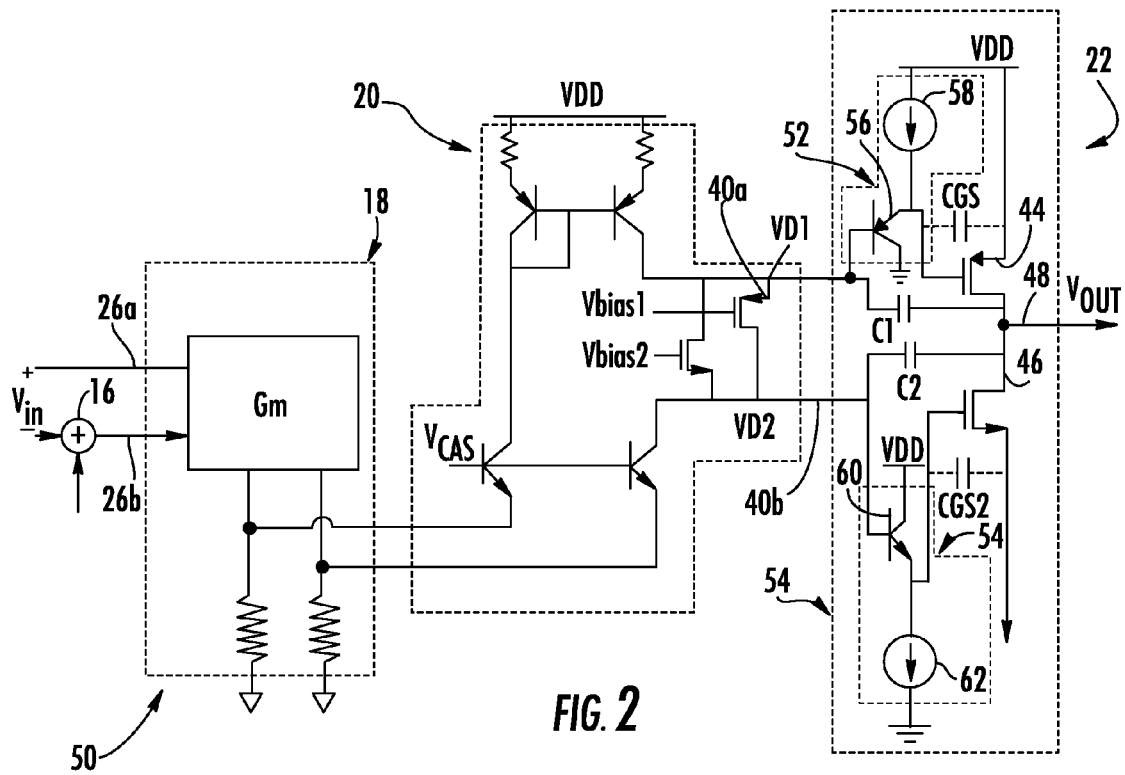
FIG. 2 is a schematic diagram of an internally compensated operational amplifier having a differential input and a single-ended output according to an embodiment of the invention.

FIG. 2 is a schematic diagram of an internally compensated operational amplifier 50 according to an embodiment of the invention, in which like numbers are used to reference components common to the operational amplifier 12 of FIG. 1. As discussed below, the amplifier 50 may introduce less distortion onto the output voltage Vout than the amplifier 12.

The operational amplifier 50 is similar to the operational amplifier 12 of FIG. 1, except that the output stage 22 includes two buffers 52 and 54, which may reduce the level of nonlinear distortion that the parasitic capacitances Cgs1 and Cgs2 (and the parasitic gate-to-drain capacitances of the transistors 44 and 46) refer back to the input nodes 26a and 26b of the input stage 18, and thus may reduce the level of nonlinear distortion present in Vout. The buffer 52 has a high-impedance input node coupled to the drive node 40a of the intermediate stage 20, and has a low-impedance output node coupled to the gate (control node) of the PMOS transistor 44. Similarly, the buffer 54 has a high-impedance input node coupled to the drive node 40b of the intermediate stage 20, and has a low-impedance output node coupled to the gate (control node) of the NMOS transistor 46. C1 is coupled between the node 40a and the output node 48, and C2 is coupled between the node 40b and the output node. The buffers 52 and 54 provide the relatively large nonlinear currents that charge and discharge Cgs1 and Cgs2 (and the parasitic gate-to-drain capacitances) to generate the nonlinear drive voltages VD1 and VD2, respectively, during transitions of Vout—as discussed above in conjunction with FIG. 1, VD1 and VD2 are nonlinear so that Vout is a linear function Vin—without heavily loading the input and intermediate stages 18 and 20. That is, the buffers 52 and 54 isolate Cgs1 and Cgs2 from VD1 and VD2. The buffers 52 and 54 also decouple, i.e., isolate, the compensation capacitors C1 and C2 from the gates of the transistors 44 and 46, respectively. Consequently, by isolating the nonlinear drive currents through Cgs1 and Cgs2 from the input and intermediate stages 18 and 20, the buffers 52 and 54 reduce the level of nonlinear distortion that is referred back to the input nodes 26a and 26b, and thus reduce the level of nonlinear distortion generated on the output node 48. In one example where C1≈C2≈2 pF and Cgs1≈Cgs2≈4 pF, the buffers 52 and 54 reduce the nonlinear distortion on Vout by approximately 9.5 dB as compared to the operational amplifier 12 of FIG. 1 having similar component values.

Still referring to FIG. 2, an embodiment of the buffer 52 includes a PNP transistor 56 and a current source 58. The PNP transistor 56 includes a base coupled to the drive node 40a, a collector coupled to ground (or to a negative supply voltage), and an emitter coupled to the gate of the PMOS drive transistor 44. The current source 58 is coupled between the supply voltage VDD and the emitter of the PNP transistor 56.

Similarly, an embodiment of the buffer 54 includes an NPN transistor 60 and a current source 62. The NPN transistor 60 includes a base coupled to the drive node 40b, a collector coupled to VDD, and an emitter coupled to the gate of the NMOS drive transistor 46. The current source 62 is coupled between ground (or a negative supply voltage) and the emitter of the transistor 60.

Still referring to FIG. 2, alternate embodiments of the operational amplifier 50 are contemplated. For example, an amplifier including a dual of one or more of the input, intermediate, and output stages 18, 20, and 22 is contemplated. For example, to make a dual of the intermediate stage 20, one effectively "flips" the stage upside down, replaces the NPN transistors 34a and 34b with PNP transistors, and replaces the PNP transistors 42 and 44 with NPN transistors. Furthermore, one can replace CMOS transistors with bipolar transistors and vice versa. In addition, the amplifier 50 may be other than a rail-to-rail amplifier. Moreover, the amplifier 50 may have a differential output. Furthermore, C1 and C2 may have different values, and Cgs1 and Cgs2 may have different values.

Figure 3:
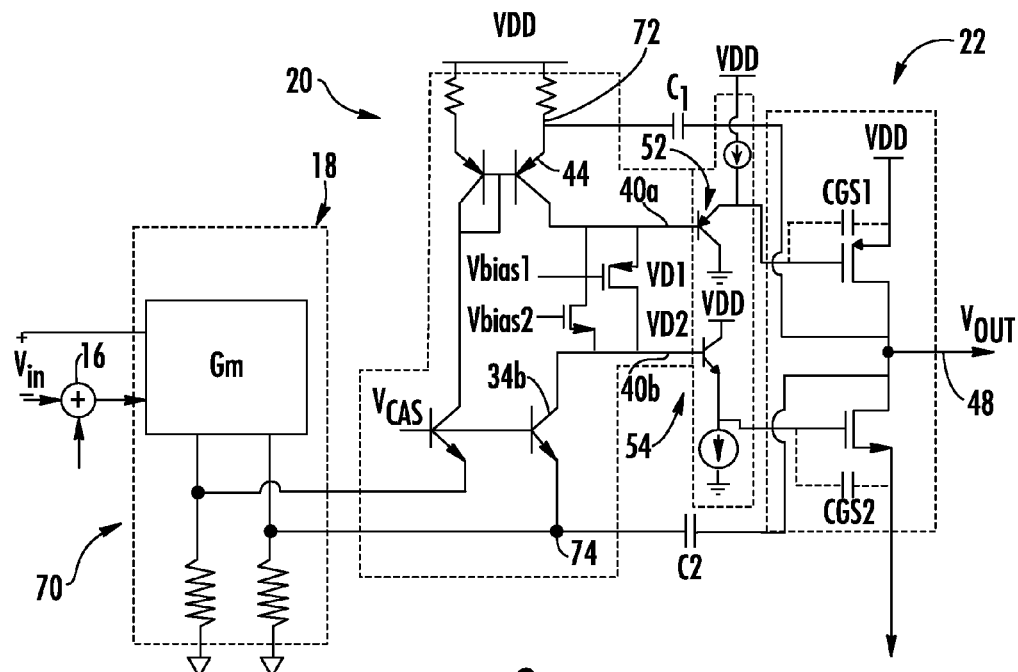
FIG. 3 is a schematic diagram of an internally compensated operational amplifier having a differential input and a single-ended output according to another embodiment of the invention.

FIG. 3 is a schematic diagram of an internally compensated operational amplifier 70 according to another embodiment of the invention, in which like numbers are used to reference components common to the operational amplifier 50 of FIG. 2. As discussed below, the amplifier 70 may introduce less distortion onto the output voltage Vout than the amplifier 50 does.

The operational amplifier 70 is similar to the operational amplifier 50 of FIG. 2, except that the compensation capacitors C1 and C2 are connected differently; these different connections may reduce the amount of nonlinear distortion that the compensation capacitors C1 and C2 refer back to the input nodes 26a and 26b. The node of C1 coupled to the drive node 40a in the amplifier 50 is instead coupled to a node 72, and the node of C2 coupled to the drive node 40b in the amplifier 50 is instead coupled to a node 74. The emitter of the current-mirror output transistor 44 renders the node 72 a low-impedance node; likewise, the emitter of the cascoded transistor 34b renders the node 74 a low-impedance node. Because the nodes 72 and 74 have low impedances and are isolated from the drive nodes 40a and 40b by the collector-emitter junctions of the transistors 44 and 34b, respectively, coupling the capacitors C1 and C2 to the nodes 72 and 74 isolates these capacitors from the nonlinear drive voltages VD1 and VD2 and from the currents and voltages that generate VD1 and VD2. Consequently, this isolation reduces the level of nonlinear distortion that C1 and C2 refer back to the input nodes 26a and 26b, and thus further reduces the level of nonlinear distortion that the amplifier 70 generates on the output node 48 (beyond the reduction provided by the buffers 52 and 54). In one example where C1≈C2≈2 pf and Cgs1≈Cgs2≈4 pF, coupling C1 and C2 to the nodes 72 and 74 lowers the nonlinear distortion on Vout by approximately 10 dB as compared to the operational amplifier 50 having similar component values, and typically by 20 dB as compared to the operational amplifier 12 (FIG. 1) having similar component values.

Still referring to FIG. 3, alternate embodiments of the operational amplifier 70 are contemplated. For example, alternate embodiments similar to those discussed above for the operational amplifier 50 (FIG. 2) are contemplated.

Figure 4:
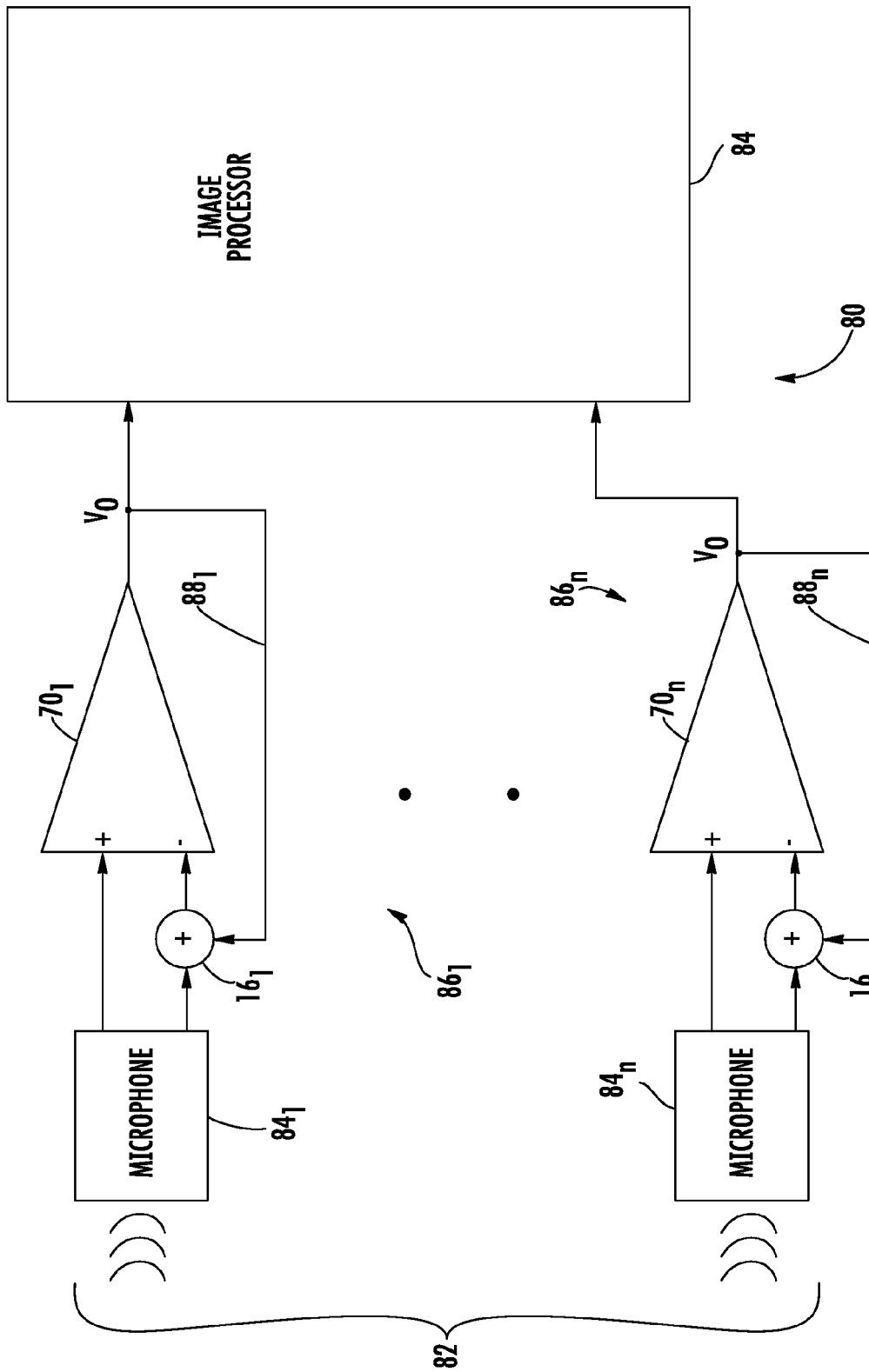
FIG. 4 is a diagram of an ultrasound system that incorporates one or more of the operational amplifiers of FIG. 2 and/or one or more of the operational amplifiers of FIG. 3 according to an embodiment of the invention.

FIG. 4 is a diagram of an ultrasound system 80, which incorporates one or more of the operational amplifiers 50 of FIG. 2 and/or one or more of the operational amplifiers 70 of FIG. 3 according to an embodiment of the invention. For clarity of explanation, however, the ultrasound system 80 is described as including multiple operational amplifiers 70.

The system 80 includes a pick-up head 82 and an image processor 84.

The pick-up head 82 includes microphones $84_1$-$84_n$ and corresponding amplifier circuits $86_1$-$86_n$, which amplify the signals from the microphones and provide the amplified signals to the image processor 84. In addition to a respective operational amplifier 70, each amplifier circuit 86 includes a respective summing junction 16 and feedback path 88. Each junction 16 may be tuned to accommodate the characteristics of the corresponding microphone 84, because these characteristics may differ from microphone to microphone.

The image processor 84 generates an image from the signals provided by the amplifier circuits $86_1$-$86_n$, where each signal represents the luminance of a respective pixel of the image.

The ultrasound system 80 may also include a display (not shown) for displaying the image.

Although described as being used in the ultrasound system 80, the operational amplifiers 50 (FIG. 2) and 70 (FIG. 3) may be used in other types of systems.

From the foregoing it will be appreciated that, although specific embodiments have been described herein for purposes of illustration, various modifications may be made without deviating from the spirit and scope of the invention. Furthermore, where an alternative is disclosed for a particular embodiment, this alternative may also apply to other embodiments even if not specifically stated.

What is claimed is:

1. An amplifier, comprising:
   an amplifier output node operable to provide an output signal; and
   an output stage including
      a first drive buffer having an input node and an output node,
      a first drive transistor having a control node coupled to the output node of the first drive buffer, a first drive node, and a second drive node coupled to the amplifier output node,
      a first compensation capacitor having a first node isolated from the control node of the first drive transistor by the first drive buffer and having a second node coupled to the amplifier output node, and
      no unbuffered non-parasitic signal path between the first node of the first compensation capacitor and the control node of the first drive transistor.

2. The amplifier of claim 1 wherein the output stage further includes:
   a second drive buffer having an input node and an output node;
   a second drive transistor having a control node coupled to the output node of the second drive buffer, a first drive node, and a second drive node coupled to the amplifier output node; and
   a second compensation capacitor having a first node isolated from the control node of the second drive transistor by the second drive buffer and having a second node coupled to the amplifier output node.

3. The amplifier of claim 1, further comprising:
   an amplifier input node operable to receive an input signal; and
   an input stage coupled to the amplifier input node and to the output stage.

4. The amplifier of claim 1 wherein the first node of the first compensation capacitor is coupled to the input node of the first drive buffer.

5. The amplifier of claim 1 wherein the output stage further includes:
   a second drive buffer having an input node and an output node;
   a second drive transistor having a control node coupled to the output node of the second drive buffer, a first drive node, and a second drive node coupled to the amplifier output node; and
   a second compensation capacitor having a first node coupled to the input node of the second drive buffer and having a second node coupled to the amplifier output node.

6. The amplifier of claim 1 wherein the first drive transistor comprises a MOS transistor having a gate coupled to the control node of the first drive transistor, a source coupled to the first drive node of the first drive transistor, and a drain coupled to the second drive node of the first drive transistor.

7. The amplifier of claim 1 wherein the output stage further includes:
   a second drive buffer having an input node and an output node;
   a second MOS drive transistor having a gate coupled to the output node of the second drive buffer, a source, and a drain coupled to the amplifier output node; and
   a second compensation capacitor having a first node isolated from the gate of the second MOS drive transistor by the second drive buffer and having a second node coupled to the amplifier output node.

8. The amplifier of claim 1 wherein the first drive buffer comprises:
   a buffer transistor having a control node coupled to the input node of the first drive buffer and a low-impedance drive node coupled to the output node of the first drive buffer; and
   a current source coupled to the output node of the first drive buffer.

9. The amplifier of claim 1 wherein the output stage further includes:
   a second drive buffer having an input node and an output node, a buffer transistor having a control node coupled to the input node of the second drive buffer and a low-impedance drive node coupled to the output node of the second drive buffer, and a current source coupled to the output node of the second drive buffer;
   a second drive transistor having a control node coupled to the output node of the second drive buffer, a first drive node, and a second drive node coupled to the amplifier output node; and
   a second compensation capacitor having a first node isolated from the control node of the second drive transistor by the second drive buffer and having a second node coupled to the amplifier output node.

10. An amplifier, comprising:
   an amplifier output node operable to provide an output signal;

an output stage including
- a first drive buffer having an input node and an output node,
- a first drive transistor having a control node coupled to the output node of the first drive buffer, a first drive node, and a second drive node coupled to the amplifier output node, and
- a first compensation capacitor having a first node isolated from the control node of the first drive transistor by the first drive buffer and having a second node coupled to the amplifier output node; and an intermediate stage coupled to the output stage and comprising a current mirror including an input transistor and including an output transistor having a low-impedance drive node coupled to the first node of the first compensation capacitor and having a high-impedance drive node coupled to the input node of the first drive buffer.

11. An amplifier, comprising:

an amplifier output node operable to provide an output signal;

an output stage including
- a first drive buffer having an input node and an output node,
- a first drive transistor having a control node coupled to the output node of the first drive buffer, a first drive node, and a second drive node coupled to the amplifier output node, and
- a first compensation capacitor having a first node isolated from the control node of the first drive transistor by the first drive buffer and having a second node coupled to the amplifier output node; and an intermediate stage coupled to the output stage and comprising a cascoded transistor having a low-impedance drive node coupled to the first node of the first compensation capacitor and having a high-impedance drive node coupled to the input node of the first drive buffer.

12. An amplifier, comprising an amplifier output node operable to provide an output signal;

an output stage including
- a first drive buffer having an input node and an output node,
- a first drive transistor having a control node coupled to the output node of the first drive buffer, a first drive node, and a second drive node coupled to the amplifier output node, and
- a first compensation capacitor having a first node isolated from the control node of the first drive transistor by the first drive buffer and having a second node coupled to the amplifier output node;

an intermediate stage coupled to the output stage and comprising
- a current mirror including an input transistor and including an output transistor having a low-impedance drive node coupled to the first node of the first compensation capacitor and having a high-impedance drive node coupled to the input node of the first drive buffer, and
- a cascoded transistor coupled to the current mirror and having a low-impedance drive node and a high-impedance drive node; and wherein the output stage further includes
- a second drive buffer having an input node and an output node,
- a second drive transistor having a control node coupled to the output node of the second drive buffer, a first drive node, and a second drive node coupled to the amplifier output node, and
- a second compensation capacitor having a first node coupled to the low-impedance drive node of the cascoded transistor and having a second node coupled to the amplifier output node.

13. An amplifier circuit, comprising:

an amplifier input node operable to receive an input signal;
an input stage coupled to the amplifier input node;
an intermediate stage coupled to the input stage;
an amplifier output node operable to provide an output signal;

an output stage coupled to the intermediate stage and the amplifier output node and including
- a first drive buffer having an input node and an output node,
- a first drive transistor having a control node coupled to the output node of the first drive buffer, a first drive node, and a second drive node coupled to the amplifier output node,
- a first compensation capacitor having a first node isolated from the control node of the first drive transistor by the first drive buffer and having a second node coupled to the amplifier output node and
- no non-parasitic signal path between the first node of the first compensation capacitor and the control node of the first drive transistor other than a buffered signal path; and a feedback stage having an input node coupled to the amplifier output node and having an output node coupled to the amplifier input node.

14. An electronic system, comprising:

an amplifier circuit, including,
- an amplifier input node operable to receive an input signal,
- an input stage coupled to the amplifier input node,
- an intermediate stage coupled to the input stage,
- an amplifier output node operable to provide an output signal,
- an output stage coupled to the intermediate stage and the amplifier output node and including
  - a first drive buffer having an input node and an output node,
  - a first drive transistor having a control node coupled to the output node of the first drive buffer, a first drive node, and a second drive node coupled to the amplifier output node,
  - a first compensation capacitor having a first node isolated from the control node of the first drive transistor by the first drive buffer and having a second node coupled to the amplifier output node; and
  - no non-parasitic signal path between the first node of the first compensation capacitor and the control node of the first drive transistor other than a signal path through the first drive buffer; and
- a feedback stage having an input node coupled to the amplifier output node and having an output node coupled to the amplifier input node.

15. A method, comprising:

driving a control node of a first drive transistor with a first buffered control signal;

generating a first component of an output signal on an output node with the first drive transistor in response to the first buffered control signal;

coupling a first compensation signal to the output node; and isolating the first compensation signal from the first buffered control signal.

16. The method of claim 15 wherein driving the control node comprises driving the control node of the drive transistor with a non-linear buffered control signal.

17. The method of claim 15, further comprising:
generating the buffered control signal from a control signal with a buffer;
generating the compensation signal from the control signal; and
wherein coupling and isolating the compensation signal comprise coupling the compensation signal to the output node via a capacitor that is coupled between an input node of the buffer and the output node.

18. The method of claim 15, further comprising:
driving a control node of a second drive transistor with a second buffered control signal;
generating a second component of the output signal on the output node with the second drive transistor in response to the second buffered control signal;
coupling a second compensation signal to the output node; and
isolating the second compensation signal from the second buffered control signal.

19. A method, comprising:
driving a control node of a first drive transistor with a first buffered control signal;
generating a first component of an output signal on an output node with the first drive transistor in response to the first buffered control signal;
coupling a first compensation signal to the output node;
isolating the first compensation signal from the first buffered control signal;
generating the compensation signal at a low-impedance drive node of a current-mirror output transistor; and
wherein coupling and isolating the compensation signal comprise coupling the compensation signal to the output node via a capacitor that is coupled between the low-impedance drive node and the output node.

20. A method, comprising:
driving a control node of a first drive transistor with a first buffered control signal;
generating a first component of an output signal on an output node with the first drive transistor in response to the first buffered control signal;
coupling a first compensation signal to the output node;
isolating the first compensation signal from the first buffered control signal;
generating the compensation signal at a low-impedance drive node of a cascoded transistor; and
wherein coupling and isolating the compensation signal comprise coupling the compensation signal to the output node via a capacitor that is coupled between the low-impedance drive node and the output node.

* * * * *